(12) United States Patent
Wang et al.

(10) Patent No.: US 7,947,412 B2
(45) Date of Patent: May 24, 2011

(54) REDUCED LENS HEATING METHODS, APPARATUS, AND SYSTEMS

(75) Inventors: Fei Wang, Boise, ID (US); Xinya Lei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 520 days.

(21) Appl. No.: 11/729,554

(22) Filed: Mar. 29, 2007

(65) Prior Publication Data
US 2008/0239272 A1    Oct. 2, 2008

(51) Int. Cl.
*G03F 1/00* (2006.01)
*G03B 27/42* (2006.01)
(52) U.S. Cl. .............................. 430/5; 355/53
(58) Field of Classification Search ............ 355/53, 355/67, 70, 71; 430/5, 394; 716/19, 21
See application file for complete search history.

(56) References Cited

U.S. PATENT DOCUMENTS

| | | | |
|---|---|---|---|
| 2002/0006734 A1* | 1/2002 | Imai et al. | 438/735 |
| 2005/0014078 A1* | 1/2005 | Baggenstoss et al. | 430/20 |
| 2006/0132748 A1* | 6/2006 | Fukuhara | 355/67 |
| 2006/0183028 A1* | 8/2006 | Meyne et al. | 430/5 |
| 2007/0224519 A1* | 9/2007 | Sivakumar et al. | 430/5 |
| 2008/0160422 A1* | 7/2008 | Chen et al. | 430/5 |
| 2008/0226992 A1* | 9/2008 | Landis et al. | 430/5 |

* cited by examiner

*Primary Examiner* — Stephen Rosasco
*Assistant Examiner* — Stewart A Fraser
(74) *Attorney, Agent, or Firm* — Schwegman, Lundberg & Woessner, P.A.

(57) ABSTRACT

In one embodiment, a system is disclosed that includes an illuminator having a source that produces light waves having a first wavelength, and a mask. The mask includes at least one partly opaque area and at least one opening within the opaque area includes a slanted, sub-resolution feature that redistributes a portion of the light passing through the open area to an off-axis location. A method of forming a device by way of photolithography might include forming unresolvable features on a mask and projecting light through the mask. Other systems, methods, and apparatus are disclosed.

18 Claims, 8 Drawing Sheets
(3 of 8 Drawing Sheet(s) Filed in Color)

REDUCED LENS HEATING METHODS, APPARATUS, AND SYSTEMS

TECHNICAL FIELD

Various embodiments described herein relate to apparatus, systems, and methods associated with information storage and processing, including the reduction of lens heating during photolithography patterning.

BACKGROUND INFORMATION

Step and repeat lithography devices, called scanners or wafer steppers, are commonly used to mass produce semiconductor devices, such as integrated circuits (ICs). Typically, a light source and various lenses are used to project an image of a mask onto a photosensitive coating of a semiconductor wafer. The projected image of the mask imparts a corresponding pattern on the photosensitive coating. This pattern may be used to selectively etch or deposit material to form desired semiconductor devices.

BRIEF DESCRIPTION OF THE DRAWINGS

The patent or application file contains at least one drawing executed in color. Copies of this patent application publication with color drawing(s) will be provided by the office upon request and payment of the necessary fee.

DETAILED DESCRIPTION

During the manufacturing process the light source may be enabled for a considerable amount of time. After some amount of time of continuous field scanning of a wafer, off-axis illumination from the light source can cause the wafer stepper's or scanner's lens to heat in a non-uniform way. In some instances, the non-uniformly heated lens may resolve light differently than a non-heated lens. When the lens resolves the light differently, the critical dimension of some features can change. In some instances, the change in the critical dimension will be significant enough to result in one or more failed semiconductor devices.

In addition, non-uniform lens heating may cause the critical dimension of a feature to vary within the scanning field. Therefore, the critical dimension of the feature may be within a tolerance limit in one area of the semiconductor device and may be outside the tolerance limit in another area of the semiconductor device.

Furthermore, continuously reducing the size of the features of semiconductor devices seems to be a constant industry goal. For example, reducing the feature size in solid-state memory architecture can be an effective way to increase the capacity of such memories for a given amount of circuit real estate. However, as the feature sizes continue to become smaller, the problem associated with off-axis lens heating may increase, since the critical dimension of certain features has a smaller tolerance range. Thus, there is a need for improved apparatus, systems, and methods to reduce non-uniform lens heating during photolithography operations.

Figure 1:
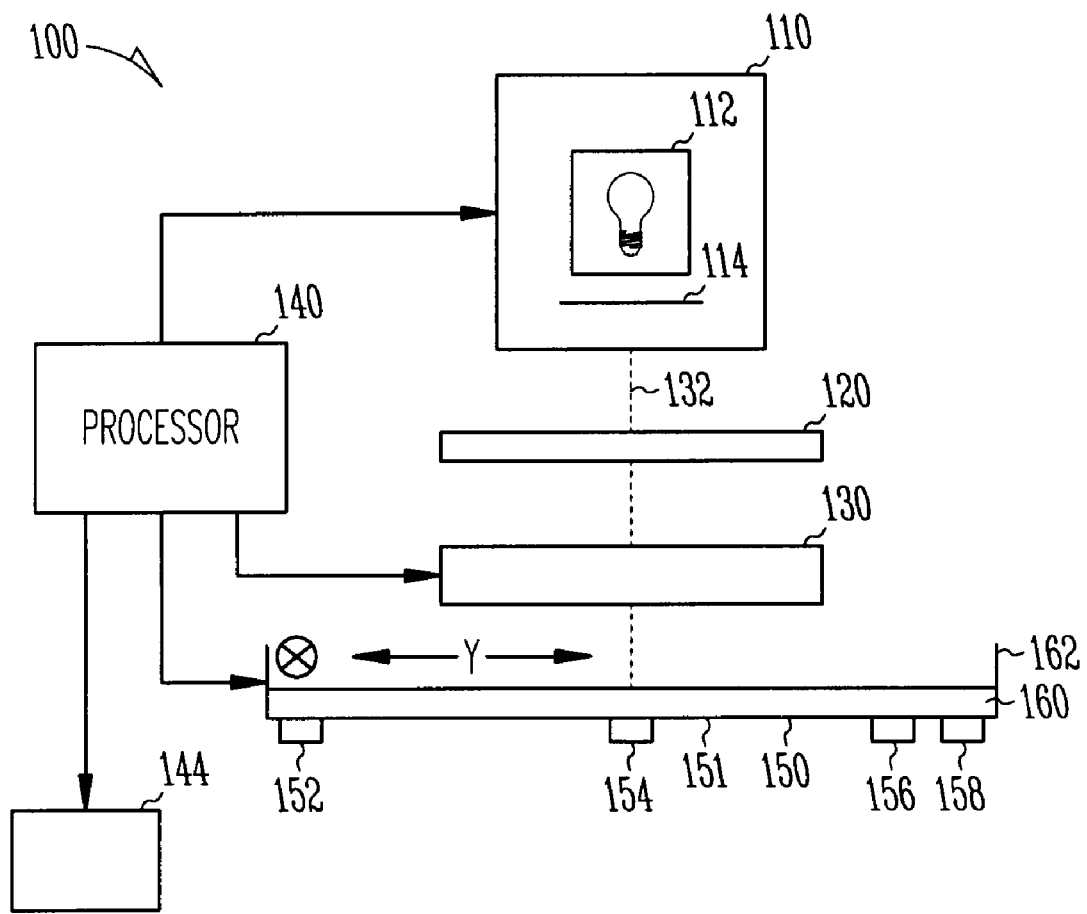
FIG. 1 is a schematic diagram of a projection system, according to an example embodiment.

FIG. 1 is a schematic diagram of a projection system 100, according to an example embodiment. The projection system 100 is used in the manufacture of electronic devices and other mechanical devices using photolithography. The projection system includes an illuminator 110. The illuminator 110 includes an illumination source, such as light source 112, an object pupil 114, a mask, such as reticle 120, and a projection lens or pupil 130. The projection system 100 is typically under the control of a microprocessor, such as processor 140 which is operatively coupled to an input device 144. The input device 144 may comprise a keyboard, control panel, or such other apparatus to permit an operator to input data or commands or to alter a computer program having an instruction set for controlling the projection system 100. In some embodiments of a projection system 100, the illuminator 110 and/or the target 160 are moved and another image is exposed on the target 160. The processor 140 is used to automatically control the movement of the target 160 and/or the illuminator 110 so that multiple exposures can be made on the target 160. In some embodiments, the target 160 comprises a wafer having a layer of photoresist, such as photoresistive material, thereon.

The illumination source 112 provides radiation of a predetermined variety in response to control signals from processor 140 coupled thereto. Typically, the radiation from illumination source 112 is in the visible light or ultraviolet wavelength range. The projection system 100 also includes mask holder (not shown) for holding the mask 120 in alignment with illumination source 112. The mask 120 includes a pattern of opaque and transparent regions in the path of radiation from illumination source 112 to cast a desired image into an optical subsystem. The optical subsystem includes the projection lens or pupil 130 and is configured to project an image along optical axis 132. The optical subsystem generally includes a series of lenses (not shown) to properly focus a received image and includes a controlled shutter coupled to processor 140 to selectively emit the image. Typically, an optical subsystem reduces the image size by a known factor relative to the size of the mask and, more specifically, to the size of the pattern on the mask 130. Of course, many projection systems, such as the projection system 100, include additional components other than the ones discussed here.

The projection system 100 may also include a multistage positioning device 150. Multistage positioning device 150 is operatively coupled to processor 140 to be controlled thereby. Multistage positioning device 150 includes a base 151 and a wafer chuck 162 configured to securely hold a semiconductor wafer 160 for lithographic processing by the projection system 100. Positioning device 150 also has a number of independently controlled positioning stages to selectively position wafer chuck 160 relative to optical axis 132 of image projection system 100.

The multistage positioning device 150 includes a stage 152, a stage 154, and a Z stage 156. The stage 152 positions wafer chuck 160 along a first axis ("X-axis") perpendicular to the view plane of FIG. 1. Stage 152 responds to a first axis control signal from processor 140 to provide a corresponding X-axis position of wafer chuck 160. The stage 154 positions wafer chuck 160 along a second axis ("Y-axis") generally perpendicular to the first axis. The stage 154 responds to a second axis control signal from processor 140 to provide a corresponding Y-axis position of wafer chuck 160. The second axis is generally parallel to the view plane of FIG. 1. The Z stage 156 is configured to move the chuck 160 along the Z-axis. In some embodiments, the multistage positioning device 150 includes a tilt stage 158 to controllably pivot wafer chuck 160 about both the X-axis and Y-axis in response to an appropriate tilt control signal from processor 140. Typically, the various stages are moved by stepper motors under control of the processor 140. As a result, such a projection system 100 is called a stepper projection system. The projection system may also be called a scanner. A stepper or scanner is configured to mass produce integrated circuits by defining a matrix of spaced-apart exposure fields.

Figure 2:
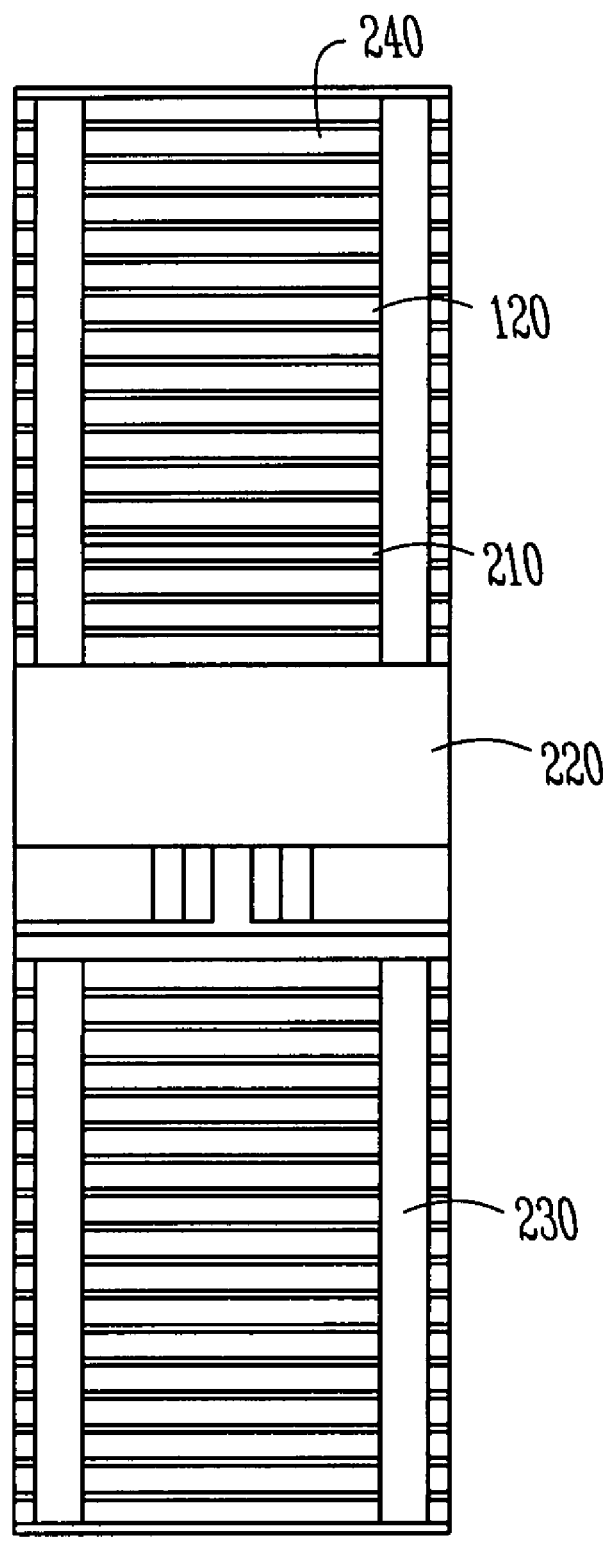
FIG. 2 is a top view of a mask showing a number of open areas in a substantially opaque layer, according to an example embodiment.

FIG. 2 is a top view of a mask 120 showing a number of open areas 210, 220, and 230 in a partly opaque layer 240, which includes a well resolvable die pattern, according to an example embodiment. As shown in FIG. 2, the opaque layer 240 may include many small openings that are used to form features on a target, such as a wafer. The mask 120 includes much larger open areas such as a center logic open area 220, or the space between dice which is also referred to as the die-between-die open area 230. In some masks, such as in this mask 120, there may be certain open areas, such as open area 210, which are formed because of the type of devices formed by the mask 120 in one area. For example, open area 210 may be referred to as a "sense amp" open area, e.g., between subarrays of the die. The partly opaque layer allows large amounts of light to pass through the mask 120 to the projection lens 130 and onto the target or wafer. The large amounts of light, when concentrated on a lens, such as projection lens 130, can cause localized heating.

Figure 3:
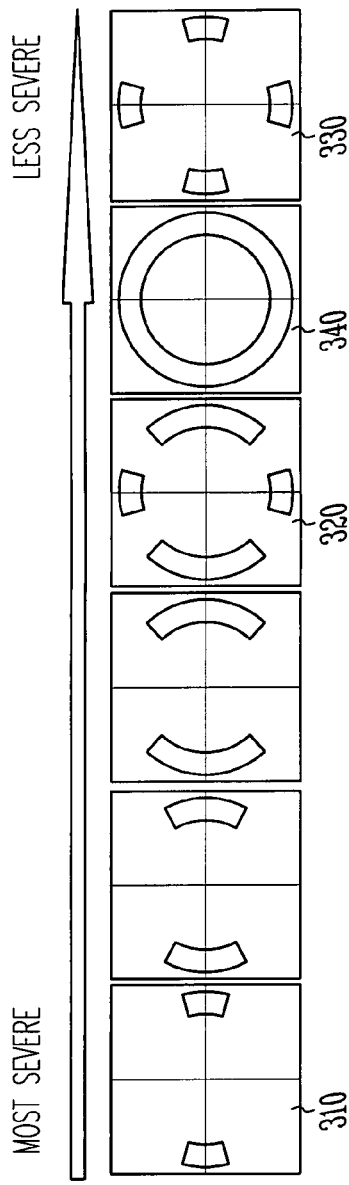
FIG. 3 is a diagram of a number of pupils for use in a projection system, according to an example embodiment.

Localization of light is more pronounced for different pupils 114. There are many types of pupil shapes, as shown in FIG. 3. One pupil 114 for imaging vertical lines and space type patterns is a dipole_35X pupil, which carries the reference number 310. The name for the dipole is derived from the shape of the light source. A dipole is a light source with two openings. The X in the notation "dipole_35X" designates that the openings are centered on an X-axis, and the 35 indicates the angle of the arc (35 degrees) of the opening. Other pupils have different shapes. There are dipoles with larger angles and additional openings, such as the I-Quad 320 and the quasar 330 and the annular 340. The dipole_35X pupil is one that can generate localized heating in a lens, such as the projection lens 130. FIG. 3 shows that the lens heating can be more severe for the dipole_X35 than for the Quasar 330. Of course, each of the pupils shown may produce localized lens heating.

Figure 4:
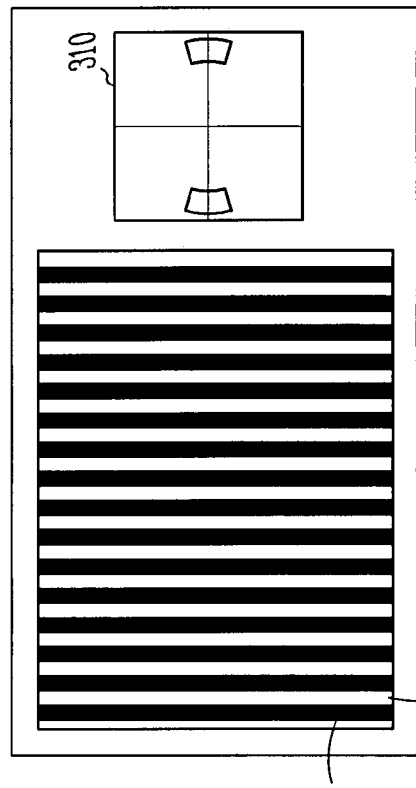
FIG. 4 is a diagram of portion of a mask that includes vertical lines and spaces which can be resolved by a light source that projects through the mask, according to an example embodiment.

FIG. 4 is a diagram of a portion of a mask 400 that includes vertical lines 410 and spaces 420 which can be resolved by a light source that projects through the mask 400, according to an example embodiment. The dipole_X35 pupil 310 can be effective in resolving such features. Many devices include vertical lines and spaces and therefore the dipole_X35 is a compelling choice for forming devices with these features. The lines 410 and spaces 420 may comprise conductors or other features. The mask 400 may be similar to or identical to the mask 120 of FIG. 1.

Turning now to FIGS. 1 and 4, it can be seen that the lines 410 and spaces 420 are dimensioned so that they can be resolved by the light from the illuminator 110, and more specifically, the light source 112, having a first wavelength. In some embodiments, the light source 112 comprises a high-pressure mercury lamp, which produces light as a current is passed through a tube of mercury. The energy from the mercury comes out in bundles of light waves grouped in ranges. These light waves are formed around peaks where the light waves have wavelengths of about 365 nm, 405 nm, and 436 nm. Filters may be used to eliminate the wavelengths of light. Of course, other light sources 112 may have different wavelengths, such as the wavelengths in the ultraviolet spectrum range. Examples are wavelengths of 248 nm and 193 nm, both of which are used in more advanced photolithographic tools.

Figure 5:
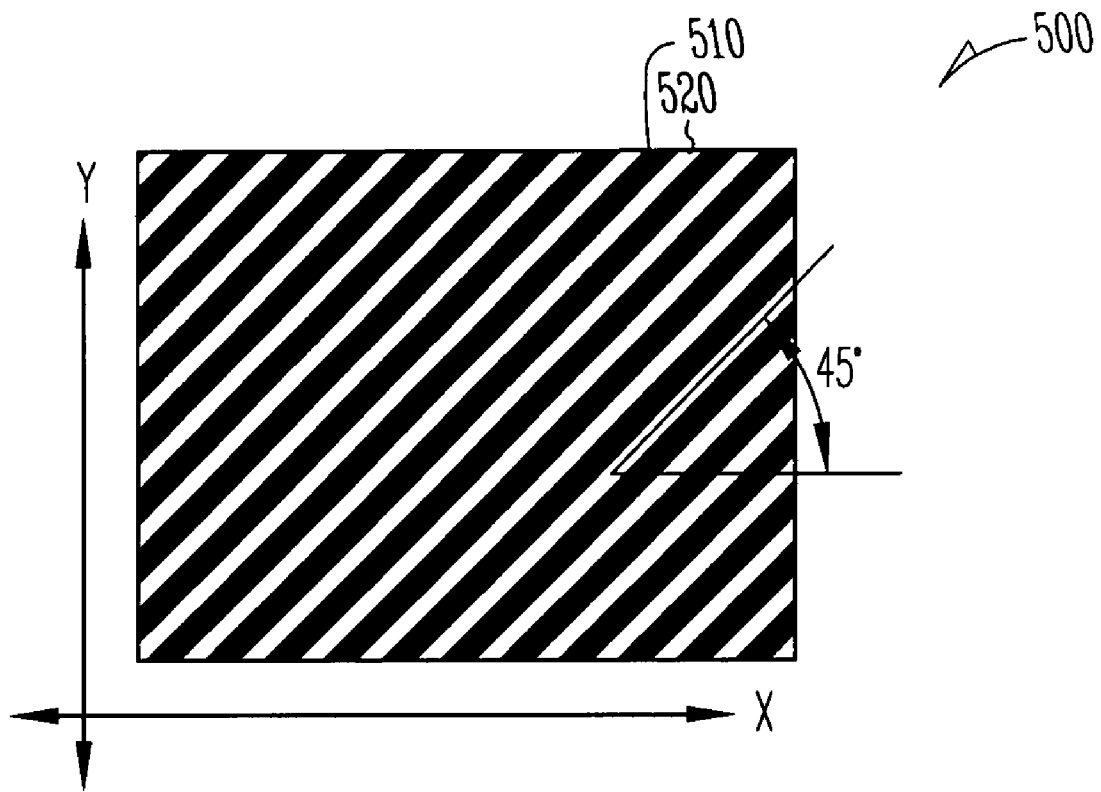
FIG. 5 is a diagram of a portion of an open area of a mask that includes slanted sub-resolution lines and spaces which can not be resolved by a light source that projects through the mask, according to an example embodiment.

FIG. 5 a diagram of a portion of an open area of a mask 500 that includes slanted sub-resolution lines 510 and spaces 520 which can not be resolved by a light source that projects through the mask 500, according to an example embodiment. Turning now to FIGS. 1 and 5, it can be seen that a portion of open area is provided with other than vertical lines and spaces that are formed so that they are unresolvable by the light source 112. The pattern of lines and spaces is slanted with respect to a vertical axis, such as the Y-axis. The angle of the slant, in some embodiments, is in the range of 30-75 degrees with respect to the X-axis, such at the X-axis of the light source 112. Since the pattern shown in FIG. 5 is used to fill an open area, the pattern is described as a slant sub-resolution fill pattern. In order to make a sub-resolution pattern (one that can not be resolved by the light source), another light source having a smaller or lesser wavelength than the light source 112 is used to form the mask 500. The mask 500 may be similar to or identical to the mask 120 of FIG. 1. For example, if the light source 112 of the projection system 100 is a mercury lamp with a wavelength of 346 nm, the second light source used to form the mask 120 has a smaller wavelength. Stated another way, the second light source used to form the mask 120 can be any light source having a wavelength less than the first light source used in the projection system 100. For example, the light source used to form the mask 120 could be an E-beam or an X-ray or any other source having a wavelength shorter than the light source 112 to be used in the projection system 100.

In operation, the slant sub-resolution fill pattern, such as the lines 510 and spaces 520 shown in FIG. 5, in the open area distracts the light intensity in the lens pupil into the concentration on the two poles whose orientation is orthogonal to the poles of a dipole source. For example, when using a Dipole_X source, a portion of the light is distracted to two Y-poles by the slant sub-resolution fill pattern. In this way, the slant sub-resolution fill pattern makes the light through the open area directionally balanced with the light through the die pattern. Therefore, the averaged light intensity on the scanning field will no longer concentrate on the two X-pole locations, which can be the main cause of lens-heating by dipole_X sources for vertical lines and spaces. The slant sub-resolution fill pattern thus can operate to redistribute the light to both X- and Y-poles. This redistribution of the light to more of a C-Quasar pattern can substantially reduce heating of the projection lens and other optical elements to effectively suppress the lens-heating-induced critical dimension (CD) variation in the scan field.

Figure 6A:
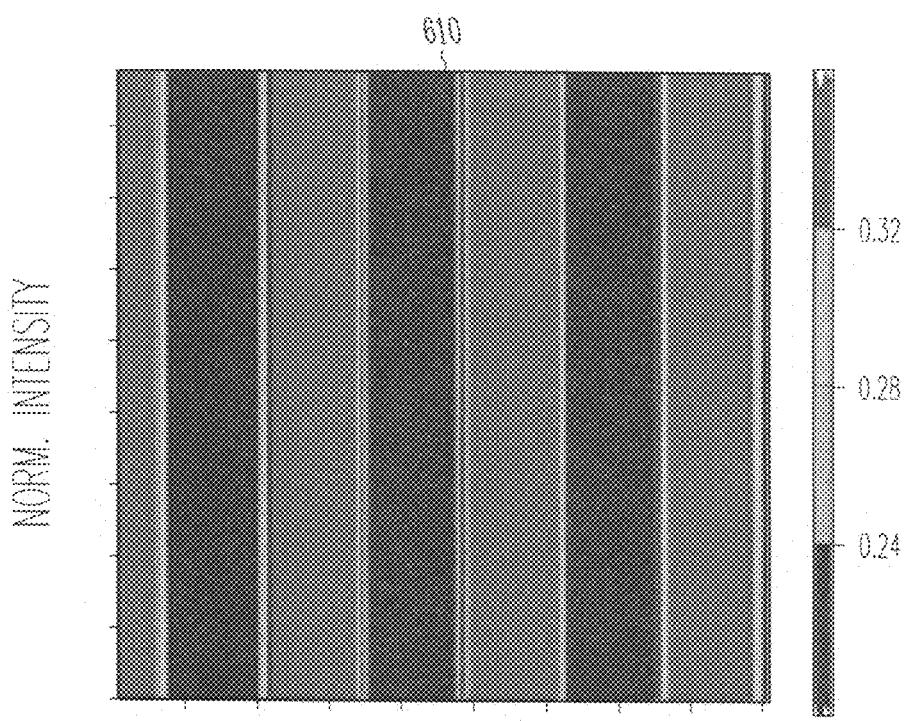
FIG. 6A, FIG. 6B, and FIG. 6C are diagrams that show the light intensity on a projection lens for various patterns on the mask when a dipole_35X source is used to project light through a die pattern and an open area in a mask, according to an example embodiment.
Figure 6A:
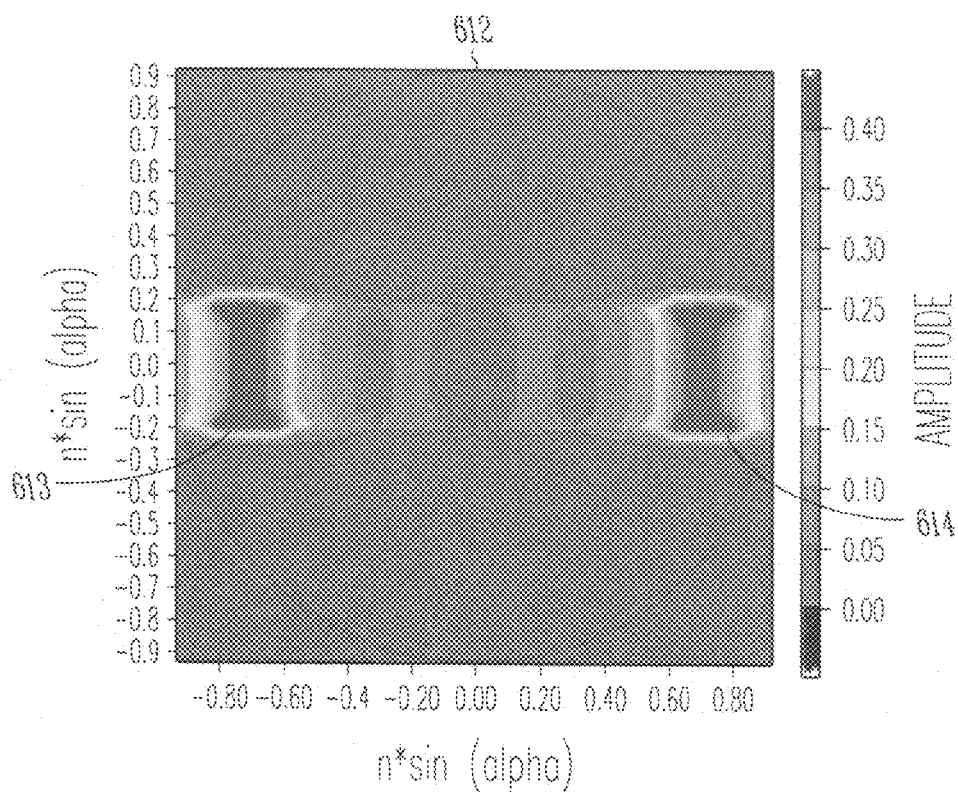
Figure 6B:
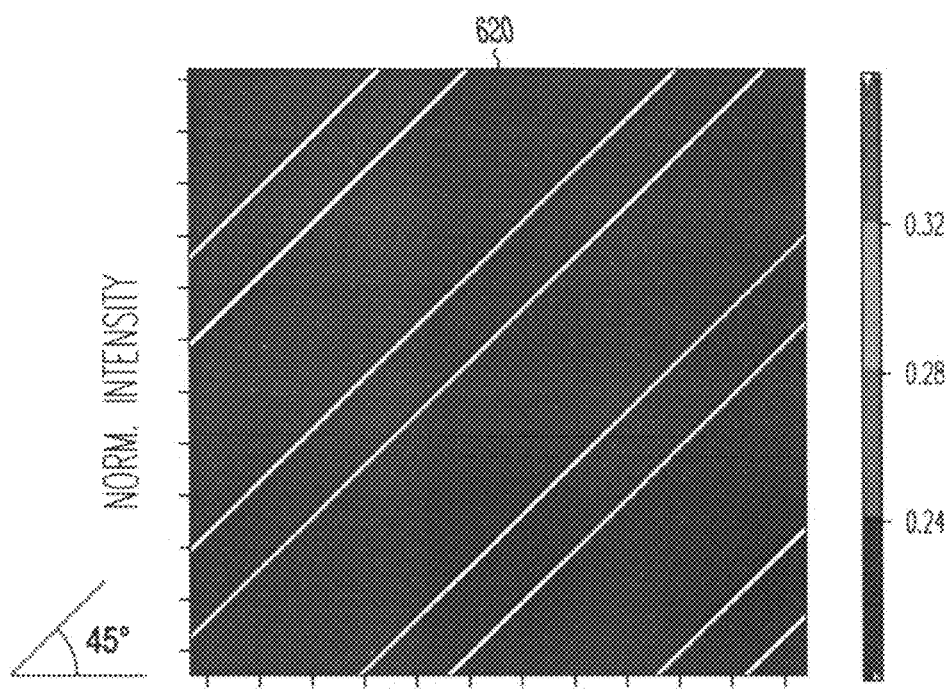
Figure 6B:
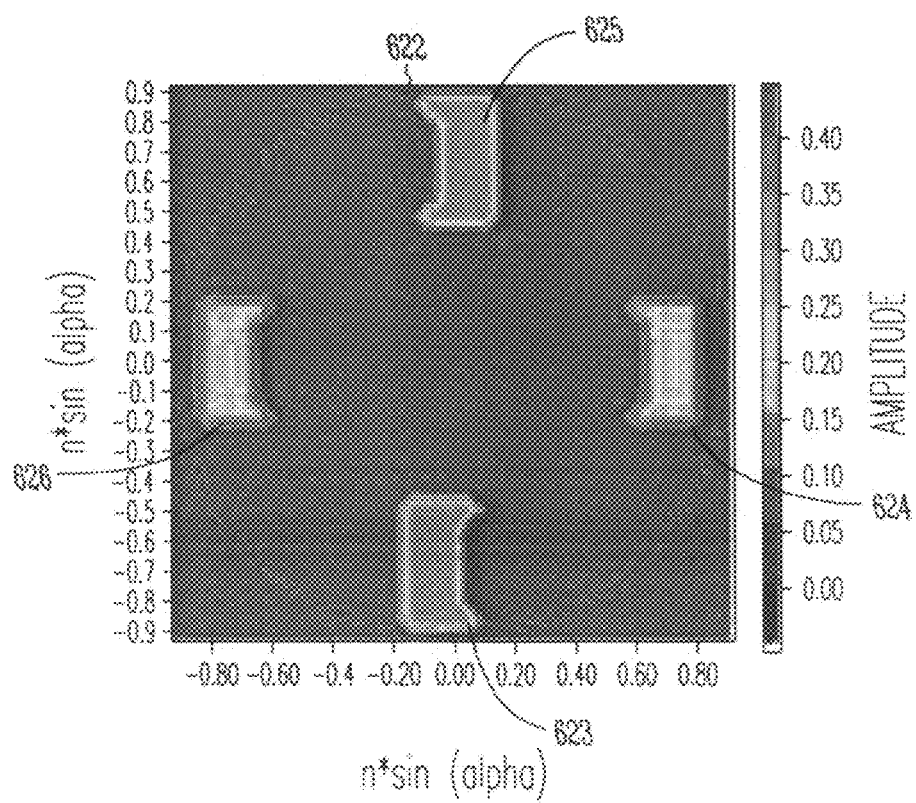
Figure 6C:
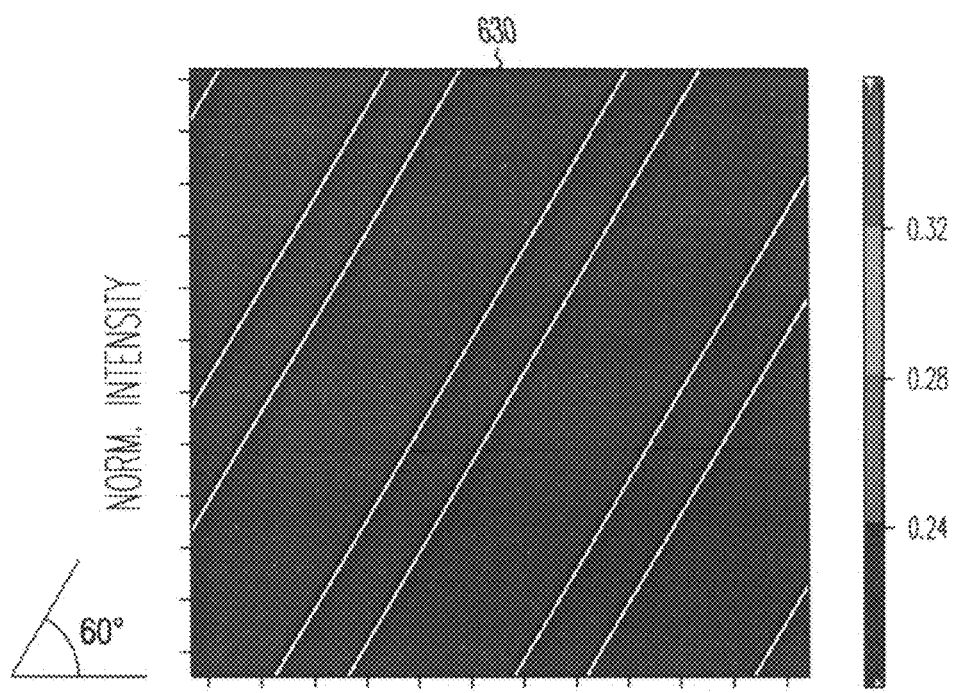
Figure 6C:
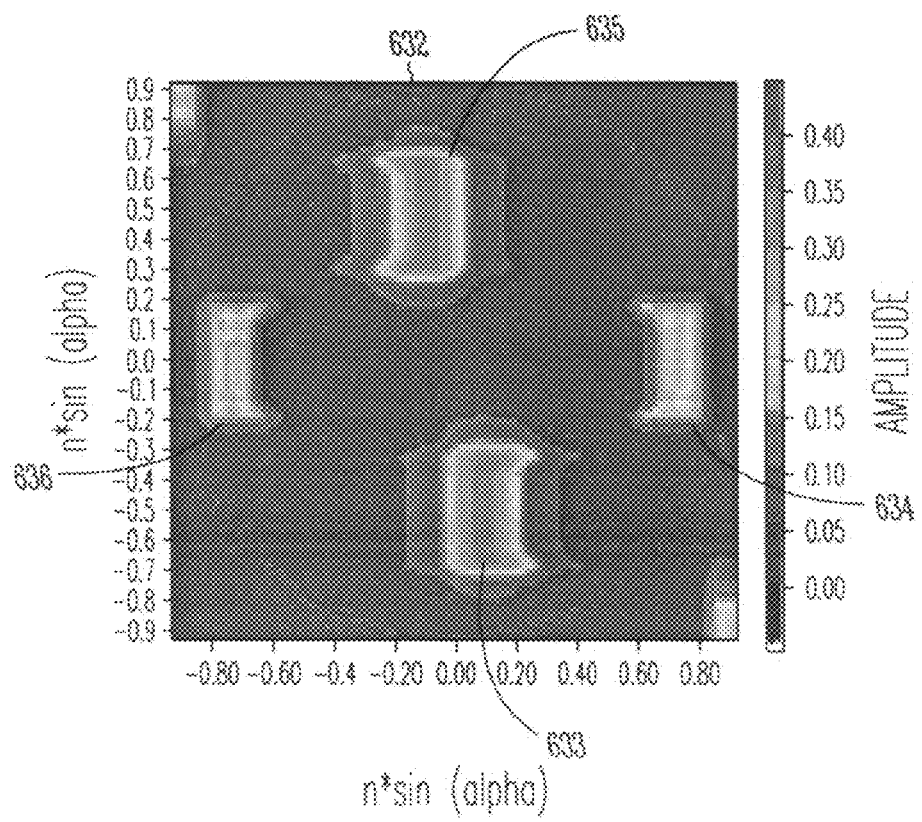

FIG. 6A, FIG. 6B, and FIG. 6C illustrate the redistribution of light discussed in the above paragraph. Turning now to FIG. 1, FIG. 6A, FIG. 6B, and FIG. 6C, it can be seen that FIG. 6A, FIG. 6B, and FIG. 6C are diagrams that show the light intensity on a projection lens, such as projection lens 130, for various patterns on the mask 120 when a dipole__35X source is used to project light through a die pattern and an open area in a mask 120, according to an example embodiment. The diagrams in FIG. 6A, FIG. 6B, and FIG. 6C show the light patterns resulting on a projection lens 130 of a projection system using a dipole_X35 pupil 114 for a well resolvable die pattern and slant sub-resolution fill patterns. As shown in FIG. 6A, a die mask with well resolvable lines and spaces is depicted by reference number 610. When light from the light source 112 is projected through the mask 120 using a dipole_X35 pupil 114, the light distribution on the projection lens, such as lens 130, is shown by graph 612, showing the light intensity on the lens pupil or projection lens. The graph 612 is a graph of n*sin(alpha) on the x axis verses n*sin(alpha) on the y axis and shows the amplitude and distribution of the projected light from the light source 112 at the projection lens 130. The value of n in the above equation denotes the refractive index of medium, and alpha is the diffracted angle of light passing through the projection lens. As can be seen at graph 612, the light intensity is higher at two areas, 613 and 614, along the X-axis. A die mask with slanted sub-resolution lines and spaces in the open area formed at a 45 degree angle with respect to the X-axis of the dipole_X35 pupil 114 is depicted by reference number 620 (FIG. 6B). When light from the light source 112 is projected through the mask 120 using a dipole_X35 pupil 114, the light distribution on the projection lens, such as lens 130, after passing through the mask 620 is shown by graph 622. Graph 620 shows the light intensity on the lens pupil or projection lens. The graph 622 is a graph of n*sin(alpha) on the x axis verses n*sin (alpha) on the y axis and shows the amplitude and distribution of the projected light from the light source 112 at the projection lens 130. As can be seen at graph 622, the light passing through the mask 620 is redistributed mostly to four locations 623, 624, 625, 626. The light intensity is higher at two areas along a Y-axis 623, 625. The light intensity at the two X-axis locations 624, 626 is lower than the Y-axis locations 625, 623. The light intensity at all four locations 623, 624, 625, 626 is less than the light intensity associated with the locations 613 and 614 in graph 612. As shown, the 45 degree slant sub-resolution line and space fill for an open space on a mask is a good choice to balance the X-dipole with the distracted Y-dipole for the lens intensity distribution. The 45 degree slant sub-resolution line and space fill is also relatively easy to form.

Other angles of slant sub-resolution line and space fill can be effective in redistributing the light intensity. For example, as shown by the mask 630 (FIG. 6C) which has 60 degree slant sub-resolution line and space fill, the resulting light intensity, as shown by graph 632 is also placed at four locations and is less than the intensity of the light shown in graph 612. As can be seen at graph 632, the light passing through the mask 630 is redistributed to essentially four locations 633, 634, 635, 636. The light intensity is higher at two areas along a Y-axis 633, 635. The light intensity at the two X-axis locations 634, 636 is lower than the Y-axis locations 635, 633. The light intensity at all four locations 633, 634, 635, 636 is less than the light intensity associated with the two locations in graph 612. The selection of non-45 degree angles for the sub-resolution line and space fill can distract the light further towards the lens center which is also beneficial in light intensity balance and lens-heating suppression. In addition to the line and space pattern, other layouts for slant sub-resolution fill patterns can also be designed to increase mask functionality as a lens-heating suppressor.

Figure 7:
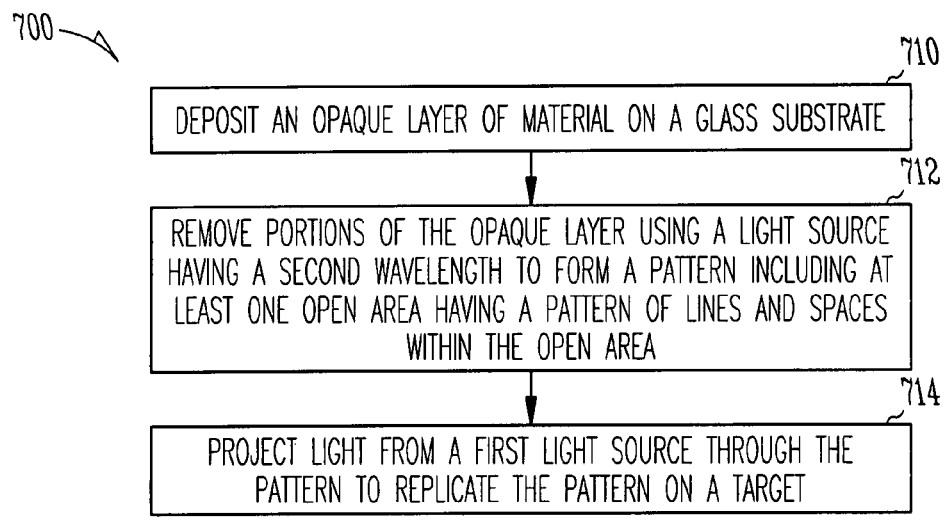
FIG. 7 is a flow diagram of a method for redistributing the light in a projection system, according to an example embodiment.

FIG. 7 is a flow diagram of a method 700 for redistributing the light in a projection system 100, according to an example embodiment. The method 700 includes depositing an opaque or partly opaque layer of material on a transparent substrate 710, and removing portions of the opaque layer using a light source having a second wavelength to form a pattern including at least one open area having a pattern of lines and spaces within the open area 712. The pattern of lines and spaces is unresolvable by a first light source. In one embodiment, the transparent substrate 710 is a glass substrate. In still another embodiment, a semi-transparent substrate is used.

The method 700 includes projecting light from a first light source through the pattern to replicate the pattern on a target 714, with at least a portion of the light from the first light source being redirected. The first light source has a wavelength longer than the second light source. Passing light through the mask includes a first portion that passes through the die pattern and a second portion that the pattern of lines and spaces in the open area is positioned to redirect a portion of the light from the first light source away from the first portion of light. In some embodiments, the light from the first light source is redirected to an off-axis area by the lines and spaces within the open area. The light from the first light source is redistributed to several locations on a projection lens.

Figure 8:
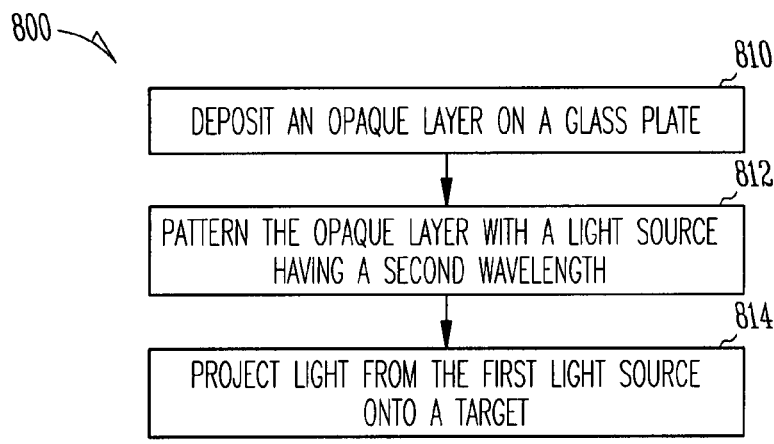
FIG. 8 is a flow diagram of forming a device by way of photolithography, according to an example embodiment.

FIG. 8 is a flow diagram of a method 800 of forming a device by way of photolithography, according to an example embodiment. The method 800 of forming a device by way of photolithography includes depositing an opaque or partly opaque layer on a transparent or semi-transparent plate 810, and patterning the opaque or partly opaque layer with a light source having a second wavelength 812. The pattern, including a feature in at least one open area, allows a first portion of light to pass and distributes a second portion of light to an off axis location. Patterning further includes selecting a feature in the open area that is unresolvable by a first light source. The light from the first light source has a wavelength that is longer than the wavelength of light from the second light source. The method 800 also includes projecting light from the first light source onto a target 814.

Figure 9:
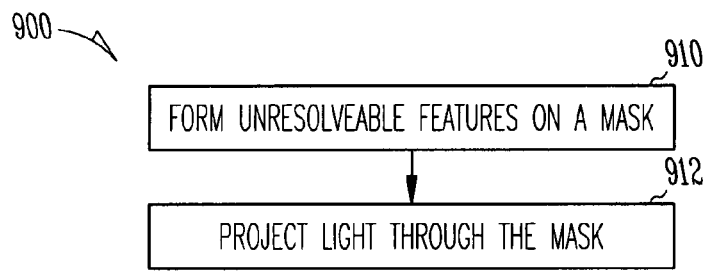
FIG. 9 is a flow diagram of a method, according to an example embodiment.

FIG. 9 is a flow diagram of a method 900, according to an example embodiment. The method 900 includes forming unresolvable features on a mask 910 and projecting light through the mask 912. The unresolvable features redirect a portion of light passing through a mask to an area on a projection lens where there is less light otherwise. Forming unresolvable features includes forming a series of lines and spaces with a light source having a shorter wavelength than the light source for projecting light through the mask.

The mask 120 for producing a semiconductor device may include a glass plate and a layer of opaque material on the glass plate. The layer of opaque material includes an open area or open areas therein. The opaque material and some of the open areas form a die pattern. The mask also includes a set of unresolvable features positioned within the at least one of the open areas. In one embodiment, the set of unresolvable features includes a pattern of lines and spaces. Generally, an X-axis is defined with respect to the mask. The set of unresolvable features includes a pattern of lines and spaces that make an angle with respect to the X-axis. The set of unresolvable features allows a second portion of light passing through the open area to be redirected away from a first portion of light passing through the die pattern. The light projected through the mask has a wavelength longer than can resolve the unresolvable features. The set of unresolvable features redirects the second portion of light to an area remote from the first portion of light that passed through the die pattern.

Thus, many embodiments of the invention may be realized. For example, a system 100 may include an illuminator 110 having an illumination source such as light source 112 that produces light waves having a first wavelength, a mask 120, and a projection lens 130. The mask 120 includes at least one partly opaque area 240 and at least one open area 210, 220, 230 within the opaque area 240. The open area 210, 220, 230 includes a feature that is smaller than can be resolved by the light waves having the first wavelength. The projection lens 130 directs the light onto a target, such as a wafer. A first portion of the light passing through the partly opaque area 240 in the mask is directed onto the target. A second portion of light passing through the open area 210, 220, 230 is redirected by the feature in the open area of the mask. The at least one feature on the mask 120 is formed with a light source having a second wavelength of light. The second wavelength of light is less than the first wavelength of light. In one embodiment the at least one feature includes a set of lines and spaces. The light source 112, and more specifically the pupil 114, is defined with respect to a coordinate system that includes an X-axis and a Y-axis. The at least one feature includes a set of lines and spaces making an angle with respect to the X-axis. In one embodiment, the set of lines and spaces makes an angle with respect to the X-axis within a range of 30 to 70 degrees. In some embodiments, the at least one feature allows a first portion of light to pass through to one of the X-axis or the Y-axis, and the at least one feature redirects a second portion of the light to a position near the other of the X-axis or the Y-axis.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A system comprising:
an illuminator that includes a source capable of producing light having a first wavelength; and
a mask that includes at least one partly opaque area and a first open area and a second open area within the partly opaque area, each of the first and second open areas is unresolvable by the light and each of the first and second open areas includes features that are smaller than can be resolved by the light having the first wavelength, wherein when the light is produced by the source, a first portion of the light passing through the partly opaque area in the mask is directed onto a target, and a second portion of light passing through the first open area and the second area is redirected by at least one of the features in the first open area and the second area of the mask, the features include slanted lines and spaces in each of the first and second open areas, wherein the lines are non-intersecting each other, and wherein none of portions of the at least one partly opaque area is between two of the features.

2. The system of claim 1, wherein the at least one open area further includes lines arranged substantially parallel to the features.

3. The system of claim 1, wherein the features include spaces.

4. The system of claim 1, wherein a direction of the light from the source is defined with respect to a coordinate system that includes an X-axis and a Y-axis, wherein slanted lines and spaces make an angle with respect to the X-axis, the angle being within a range of about 30 to 70 degrees with respect to the X-axis.

5. The system of claim 1 wherein a direction of the light from the source is defined with respect to a coordinate system that includes an X-axis and a Y-axis, wherein the features allow the first portion of the light to pass to a position near one of the X-axis or the Y-axis, and the features redirect the second portion of the light to a position near the other of the X-axis or the Y-axis.

6. A system comprising:
a source to produce light; and
a mask including a first area and a second area, wherein when the source produces the light, the first area is resolvable by the light and the second area is unresolvable by the light, the second area including slanted lines and spaces within the second area, wherein the lines are non-intersecting each other, wherein none of portions of the first area is between two of the spaces.

7. The system of claim 6, wherein the spaces are arranged substantially parallel to each other.

8. The system of claim 7, wherein the second area further includes lines arranged substantially parallel to the spaces, such that at least one of the lines is between two of the spaces.

9. The system of claim 6, wherein a direction of the light from the source is defined with respect to a coordinate system that includes an X-axis and a Y-axis, wherein the slanted lines and spaces are arranged at an angle with respect to the X-axis, and wherein the angle has range of about 30 degrees to about 70 degrees.

10. The system of claim 6, wherein the first area is partly opaque.

11. The system of claim 10, wherein the first area includes patterns to form features on a semiconductor wafer.

12. A system comprising:
a source to produce light; and
a mask including patterns to form features on an electronic device, the mask including a first area and a second area, wherein when the source produces the light, the first area is resolvable by the light and the second area is unresolvable by the light, the second area including slanted lines and spaces within the second area, wherein the lines are non-intersecting each other, and wherein the second area corresponds to one of logic area on the electronic device and sense amplifier circuitry area on the device.

13. The system of claim 12, wherein the mask further includes an additional area corresponding to an area between semiconductor dice, and the electronic device is located at one of the semiconductor dice, and wherein when the source produces the light, the additional area is unresolvable by the light.

14. The system of claim 12, wherein the second area includes spaces, and none of portions of the first area is between two of the spaces.

15. The system of claim 14, wherein a direction of the light from the source is defined with respect to a coordinate system that includes an X-axis and a Y-axis, wherein the slanted lines and spaces are arranged at an angle with respect to the X-axis, and the angle is within a range of about 30 to 70 degrees with respect to the X-axis.

16. The system of claim 12, wherein the first area includes at least a part of the patterns to form at least a part of the features on the electronic device.

17. The system of claim 16, wherein the mask includes a plate and an opaque material on the plate.

18. The system of claim 17, wherein the plate includes a glass material.

* * * * *